(12) United States Patent
Shinoda et al.

(10) Patent No.: US 10,988,636 B2
(45) Date of Patent: Apr. 27, 2021

(54) POLISHING COMPOSITION AND METHOD FOR MANUFACTURING SAME, POLISHING METHOD, AND METHOD FOR MANUFACTURING SUBSTRATE

(71) Applicant: FUJIMI INCORPORATED, Aichi (JP)

(72) Inventors: Toshio Shinoda, Aichi (JP); Aya Nishimura, Aichi (JP)

(73) Assignee: FUJIMI INCORPORATED, Aichi (JP)

( * ) Notice: Subject to any disclaimer, the term of this patent is extended or adjusted under 35 U.S.C. 154(b) by 0 days.

Patent file contains an affidavit/declaration under 37 CFR 1.130(b).

(21) Appl. No.: 16/535,570

(22) Filed: Aug. 8, 2019

(65) Prior Publication Data
US 2020/0048497 A1 Feb. 13, 2020

(30) Foreign Application Priority Data
Aug. 10, 2018 (JP) .............................. JP2018-151498

(51) Int. Cl.
*C09G 1/02* (2006.01)
*H01L 21/321* (2006.01)
*H01L 21/306* (2006.01)

(52) U.S. Cl.
CPC ............ *C09G 1/02* (2013.01); *H01L 21/3212* (2013.01); *H01L 21/30625* (2013.01)

(58) Field of Classification Search
CPC . C09G 1/02; H01L 21/3212; H01L 21/31053; H01L 21/30625
See application file for complete search history.

(56) References Cited

U.S. PATENT DOCUMENTS

| | | | |
|---|---|---|---|
| 2007/0184661 A1* | 8/2007 | Bian | C09G 1/02 438/692 |
| 2013/0146804 A1* | 6/2013 | Mizuno | H01L 21/31053 252/79.1 |
| 2014/0342561 A1* | 11/2014 | Yokota | C09G 1/02 438/693 |
| 2017/0292039 A1* | 10/2017 | Sato | C09G 1/02 |
| 2018/0111248 A1* | 4/2018 | Mitsumoto | C11D 3/33 |
| 2019/0085205 A1* | 3/2019 | Chien | C09G 1/02 |

FOREIGN PATENT DOCUMENTS

| | | |
|---|---|---|
| JP | 2004-335978 A | 11/2004 |
| JP | 2013-041992 A | 2/2013 |

OTHER PUBLICATIONS

E. Cano-Serrano, Sulfonic acid-functionalized silica through quantitative oxidation of thiol groups, ChemComm, 2003, 246-247.
Kazuo Yamaguchi, Novel Silane Coupling Agents Containinga Photolabile 2-Nitrobenzyl Ester for Introduction of a Carboxy Group on the Surface of Silica Gel, Chemistry Letters, 2000, 228-229.

* cited by examiner

*Primary Examiner* — Anita K Alanko
(74) *Attorney, Agent, or Firm* — Katten Muchin Rosenman LLP

(57) ABSTRACT

To provide a polishing composition capable of polishing an object to be polished containing a silicon nitride film at a high polishing removal rate and reducing the particle residual amount on the object to be polished and a method for manufacturing the same, a polishing method, and a method for manufacturing a substrate.

A polishing composition is a polishing composition containing abrasives, an anionic surfactant, and a dispersion medium, in which the anionic surfactant has at least one kind of acidic functional group selected from the group consisting of a sulfo group, a phosphate group, and a phosphonic acid group and a polyoxyalkylene group and the pH is less than 7 and which is used for polishing an object to be polished containing a silicon nitride film.

14 Claims, No Drawings

POLISHING COMPOSITION AND METHOD FOR MANUFACTURING SAME, POLISHING METHOD, AND METHOD FOR MANUFACTURING SUBSTRATE

BACKGROUND OF THE INVENTION

Field of the Invention

The present invention relates to a polishing composition and a method for manufacturing the same, a polishing method, and a method for manufacturing a substrate.

Description of the Related Art

A process of manufacturing a semiconductor device includes a process of polishing an object to be polished, such as simple substance silicon (Si), a silicon compound, and metal. For example, it is required to polish a silicon nitride (SiN) film having poor chemical reactivity at a high polishing removal rate. As a polishing composition conventionally used in order to polish the silicon nitride film, polishing compositions disclosed in Patent Documents 1 to 3 are mentioned, for example.

However, the conventional polishing compositions can polish the object to be polished containing the silicon nitride film at a high polishing removal rate but have not sufficiently satisfied a demand of users about the amount of abrasives remaining on the objects to be polished, a so-called particle residual amount.

CITATION LIST

Patent Literature

PTL 1: Domestic re-publication of PCT International Application Publication No. 2011-93153 A
PTL 2: JP 2013-41992 A
PTL 3: JP 2004-335978 A

SUMMARY OF THE INVENTION

Thus, the present invention has solved the above-described problem of the conventional art. It is an object of the present invention to provide a polishing composition capable of polishing an object to be polished containing a silicon nitride film at a high polishing removal rate and reducing the particle residual amount on the object to be polished and a method for manufacturing the same, a polishing method, and a method for manufacturing a substrate.

In order to solve the above-described problem, a polishing composition according to one aspect of the present invention is a polishing composition containing abrasives, an anionic surfactant, and a dispersion medium, in which the anionic surfactant has at least one kind of acidic functional group selected from the group consisting of a sulfo group, a phosphate group, and a phosphonic acid group and a polyoxyalkylene group and the pH is less than 7 and which is used in order to polish an object to be polished containing a silicon nitride film.

In the polishing composition according to one aspect described above, the polyoxyalkylene group may be bonded to the acidic functional group. The abrasives may be anionic group-modified silica. The abrasives may be sulfo group-modified silica.

In the polishing composition according to one aspect described above, the polyoxyalkylene group may be at least one kind of functional group selected from a polyoxyethylene group, a polyoxymethylene group, a polyoxypropylene group, and a polyoxybutylene group. Furthermore, the number of repetitions of the polyoxyalkylene group may be within the range of 1 or more and 6 or less.

In the polishing composition according to one aspect described above, the pH may be 3 or less.

In the polishing composition according to one aspect described above, the content of the anionic surfactant may be within the range of 0.0005% by mass or more and 0.1% by mass or less based on the entire polishing composition. The weight average molecular weight of the anionic surfactant may be within the range of 200 or more and 1,000 or less.

A method for manufacturing a polishing composition according to another aspect of the present invention is a method for manufacturing the polishing composition according to one aspect described above and includes mixing the abrasives, the anionic surfactant, and the dispersion medium and setting the pH to less than 7.

A polishing method according to another aspect of the present invention includes polishing an object to be polished containing a silicon nitride film using the polishing composition according to one aspect described above.

A method for manufacturing a substrate according to another aspect of the present invention includes polishing the surface of the substrate using the polishing composition according to one aspect described above.

The polishing composition and the polishing method of the present invention can polish the object to be polished containing a silicon nitride film at a high polishing removal rate and can reduce the particle residual amount on the object to be polished. Moreover, the method for manufacturing a polishing composition of the present invention can manufacture a polishing composition polishing the object to be polished containing the silicon nitride film at a high polishing removal rate and reducing the particle residual amount on the object to be polished. Moreover, the method for manufacturing a substrate of the present invention can manufacture a substrate which contains the object to be polished containing the silicon nitride film, the surface of which is polished, and in which the particle residual amount on the object to be polished is reduced.

DESCRIPTION OF THE PREFERRED EMBODIMENTS

An embodiment of the present invention is described in detail. A polishing composition according to this embodiment is a polishing composition containing abrasives, an anionic surfactant, and a dispersion medium, in which the anionic surfactant has at least one kind of acidic functional group selected from the group consisting of a sulfo group, a phosphate group, and a phosphonic acid group and a polyoxyalkylene group and the pH is less than 7 and which is used in order to polish an object to be polished containing a silicon nitride film. The polishing composition can be manufactured by mixing the anionic surfactant having at least one kind of acidic functional group selected from the group consisting of a sulfo group, a phosphate group, and a phosphonic acid group and the polyoxyalkylene group, abrasives, and a dispersion medium and setting the pH to less than 7. The above-described anionic surfactant may also be sometimes referred to as a anionic surfactant.

The polishing composition is suitable for the use of a polishing object to be polished, such as simple substance silicon, a silicon compound, and metal, e.g., the use of polishing the surface containing simple substance silicon, a silicon compound, metal, and the like of a semiconductor wiring board in a process of manufacturing a semiconductor device. The polishing composition is particularly suitable for the use of polishing a silicon nitride film. When the polishing is performed using the polishing composition, the object to be polished, such as simple substance silicon, a silicon compound, and metal, particularly a silicon nitride film, can be polished at a high polishing removal rate and the particle residual amount on the object to be polished, particularly on the silicon nitride film, can be reduced.

Hereinafter, the polishing composition according to this embodiment is described in detail.

1. Anionic Surfactant

The anionic surfactant having at least one kind of acidic functional group selected from the group consisting of a sulfo group, a phosphate group, and a phosphonic acid group and a polyoxyalkylene group according to this embodiment contributes to polishing of a specific object to be polished at a high polishing removal rate and contributes to a reduction in the particle residual amount on the object to be polished. In particular, the anionic surfactant is effective in a reduction in the particle residual amount on an object to be polished containing a silicon nitride film. The mechanism about the reduction in the particle residual amount is described later.

The anionic surfactant having at least one kind of acidic functional group selected from the group consisting of a sulfo group, a phosphate group, and a phosphonic acid group and a polyoxyalkylene group is sometimes added as one of surfactants to the polishing composition. However, it is not known that the anionic surfactant contributes to the polishing of a specific object to be polished at a high polishing removal rate and contributes to the reduction in the particle residual amount on the object to be polished. More specifically, it is not known that the anionic surfactant having at least one kind of acidic functional group selected from the group consisting of a sulfo group, a phosphate group, and a phosphonic acid group and a polyoxyalkylene group functions as an abrasive (particle) residue inhibitor. It is a matter of course that the anionic surfactant having at least one kind of acidic functional group selected from the group consisting of a sulfo group, a phosphate group, and a phosphonic acid group and a polyoxyalkylene group also functions as a surfactant in the polishing composition.

Examples of the anionic surfactant having at least one kind of acidic functional group selected from the group consisting of a sulfo group, a phosphate group, and a phosphonic acid group and a polyoxyalkylene group include compounds represented by the following general formula (A) to the following general formula (C), for example.

$$RO(C_yH_{2y}O)_zSO_3M \quad (A)$$

$$RO(C_yH_{2y}O)_zPO_3M_2 \quad (B)$$

$$\{RO(C_yH_{2y}O)_z\}_2PO_2M \quad (C)$$

In the expressions, R represents an aromatic hydrocarbon group which may be substituted or $C_xH_{2x+1}$ (x is an integer of 6 or more and 18 or less), y represents an integer of 1 or more and 4 or less, z represents an integer of 1 or more and 6 or less, and M represents a hydrogen atom, an alkyl group, an alkali metal, or $NH_4$.

Examples of the aromatic hydrocarbon group include aryl groups, such as a phenyl group, a tolyl group, a xylyl group, a naphthyl group, an anthryl group, and an arylphenyl group; aralkyl groups, such as a benzyl group, a phenethyl group, and a naphthylmethyl group, and the like. Among the above, the aryl groups are preferable and the aryl phenyl group is more preferable.

The alkali metal is not particularly limited and is preferably sodium from the viewpoint of ease of acquisition.

More specifically, the polyoxyalkylene group contained in the anionic surfactant according to this embodiment may be bonded to at least one kind of acidic functional group selected from the group consisting of a sulfo group, a phosphate group, and a phosphonic acid group. Herein, the "bond" described above refers to a state where the polyoxyalkylene group and the acidic functional group are coupled in a straight chain shape.

The polyoxyalkylene group contained in the anionic surfactant according to this embodiment may be at least one kind of functional group selected from a polyoxymethylene group, a polyoxyethylene group, a polyoxypropylene group, and a polyoxybutylene group.

The number of repetitions of the polyoxyalkylene group contained in the anionic surfactant according to this embodiment may be within the range of 1 or more and 6 or less. When the number of repetitions of the polyoxyalkylene group is 0 i.e., when the anionic surfactant does not have the polyoxyalkylene group, the adsorption properties to the abrasives and the object to be polished of the anionic surfactant are low and the particle residual amount on the object to be polished does not decrease in some cases. When the number of repetitions of the polyoxyalkylene group is 7 or more, the viscosity of the anionic surfactant increases and the handling becomes difficult in some cases.

The anionic surfactants mentioned above may be used alone or in combination of two or more kinds thereof.

Among the anionic surfactants mentioned above, sodium polyoxyalkylene allyl phenyl ether sulfate, polyoxyethylene alkyl (C10) ether phosphoric acid ester, sodium dipolyoxyethylene (10) lauryl ether phosphate, and sodium dipolyoxyethylene (2) lauryl ether phosphate are preferable and sodium polyoxyalkylene allyl phenyl ether sulfate (having an aromatic hydrocarbon group as R) is more preferable. Herein, "C10" of the "polyoxyethylene alkyl (C10) ether phosphoric acid ester" means that the number of the carbon atoms of the alkyl is 10. "10" of the "sodium dipolyoxyethylene (10) lauryl ether phosphate" means that the average number of repetitions of the oxyethylene unit of the polyoxyethylene is 10. The same also applies to the "sodium dipolyoxyethylene (2) lauryl ether phosphate".

It is expected that, when the content of the anionic surfactant in the entire polishing composition is larger, an object to be polished, particularly the silicon nitride film, can be polished at a high polishing removal rate and the electrostatic repulsion force and the steric repulsion force described later become higher. Therefore, the content of the anionic surfactant in the entire polishing composition is preferably 0.0005% by mass (5 ppm) or more, more preferably 0.001% by mass (10 ppm) or more, still more preferably 0.01% by mass (100 ppm) or more, and particularly preferably 0.03% by mass (300 ppm) or more. When the content of the anionic surfactant in the entire polishing composition is smaller, the cost of the polishing composition can be reduced and the residual amount of the anionic surfactant to the polished surface of the object to be polished after the polishing is reduced, so that the cleaning efficiency further improves. Therefore, the content of the anionic surfactant in the entire polishing composition is preferably 0.1% by mass (1,000 ppm) or less and more preferably 0.07% by mass (700 ppm) or less.

The weight average molecular weight of the anionic surfactant is preferably within the range of 200 or more and 1,000 or less. When the weight average molecular weight of the anionic surfactant is less than 200, the adsorption properties to the abrasives and the silicon nitride film tend to be insufficient. When the weight average molecular weight of the anionic surfactant exceeds 1,000, the polishing removal rate of the silicon nitride film tends to decrease.

The weight average molecular weight of the anionic surfactant in this embodiment is a value measured using a GPC (Gel Osmosis Chromatography).

Hereinafter, the mechanism that the particle residual amount on the object to be polished containing the silicon nitride film decreases by compounding the anionic surfactant according to this embodiment in the polishing composition is not necessarily clear but is assumed as follows, for example.

The anionic surfactant having at least one kind of acidic functional group selected from the group consisting of a sulfo group, a phosphate group, and a phosphonic acid group and a polyoxyalkylene group has high adsorption properties to the abrasives and the silicon nitride film containing silica, for example, and can negatively charge the object to be polished containing the silicon nitride film in an acidic environment. As a result, electrostatic repulsion force can be generated between the negatively charged abrasives and the negatively charged object to be polished. The anionic surfactant according to this embodiment can also generate steric repulsion force resulting from the steric hindrance of surfactants between the abrasives and the silicon nitride film. It is considered that the particle residual amount on the silicon nitride film can be reduced by the repulsion force described above. It is considered that the polyoxyalkylene group contributes to the adsorption to the abrasives and the silicon nitride film of the anionic surfactant according to this embodiment.

2. Abrasives
2-1 Type

The abrasives serve to physically polish the surface of the object to be polished. The type of the abrasives is not particularly limited and silica particles, alumina particles, oxide particles, such as cerium oxide particles, chromium oxide particles, titanium dioxide particles, zirconium oxide particles, magnesium oxide particle, manganese dioxide particles, zinc oxide particles, and red oxide particles, nitride particles, such as silicon nitride particles and boron nitride particles, carbide particles, such as silicon carbide particles and boron carbide particles, carbonates, such as calcium carbonate and barium carbonate, diamond particles, and the like are mentioned.

Among the specific examples, silica is preferable. Specific examples of the silica include silica particles selected from colloidal silica, fumed silica, and sol-gel process silica. Among the silica particles, silica particles selected from colloidal silica and fumed silica, particularly colloidal silica, is preferably used from the viewpoint of reducing scratches generated in the polished surface of the object to be polished. The abrasives may be used alone or in combination of two or more kinds thereof.

2-2 Aspect Ratio

The aspect ratio of the abrasives, i.e., polishing particles, is preferably less than 1.4, more preferably 1.3 or less, and still more preferably 1.25 or less. Thus, the surface roughness of the object to be polished due to the abrasive shape can improve.

The aspect ratio is an average value of values obtained by dividing the length of the long side of the minimum rectangle circumscribing the polishing particles by the length of the short side of the same rectangle and can be determined using general image analysis software from an image of the polishing particles obtained by a scanning electron microscope (SEM).

2-3 Average Primary Particle Diameter

The average primary particle diameter of the abrasives is preferably 5 nm or more, more preferably 7 nm or more, and still more preferably 10 nm or more. The average primary particle diameter of the abrasives is preferably 200 nm or less, more preferably 150 nm or less, and still more preferably 100 nm or less.

With such a range, the polishing removal rate of the object to be polished by the polishing composition improves. Moreover, the occurrence of dishing in the surface of the object to be polished after the polishing using the polishing composition can be further suppressed.

The average primary particle diameter of the abrasives is calculated based on the specific surface area of the abrasives measured by the BET method, for example.

2-4 Average Secondary Particle Diameter

The average secondary particle diameter of the abrasives is preferably 25 nm or more, more preferably 30 nm or more, and still more preferably 35 nm or more. The average secondary particle diameter of the abrasives is preferably 300 nm or less, more preferably 260 nm or less, and still more preferably 220 nm or less.

With such a range, the polishing removal rate of the object to be polished by the polishing composition improves. Moreover, the generation of surface defects in the surface of the object to be polished after the polishing using the polishing composition can be further suppressed.

The secondary particles as used herein refer to particles formed by the aggregation of abrasives (primary particles) in the polishing composition. The average secondary particle diameter of the secondary particles can be measured by a dynamic light scattering method, for example.

2-5 Particle Diameter Distribution

A ratio D90/D10 of a diameter D90 of the particles when the cumulative particle mass from the fine particle side reaches 90% of the total particle mass to a diameter D10 of the particles when the cumulative particle mass from the fine particle side reaches 10% of the total particle mass in the particle diameter distribution of the abrasives is preferably 1.5 or more, more preferably 1.8 or more, and still more preferably 2.0 or more. The ratio D90/D10 is preferably 5.0 or less and more preferably 3.0 or less.

With such a range, the polishing removal rate of the object to be polished improves and the generation of surface defects in the surface of the object to be polished after the polishing using the polishing composition can be further suppressed.

The particle diameter distribution of the abrasives can be determined by a laser diffraction scattering method, for example.

2-6 Content of Abrasives

The content of the abrasives in the entire polishing composition is preferably 0.005% by mass or more, more preferably 0.50% by mass or more, still more preferably 1.00% by mass or more, and particularly preferably 5.00% by mass or more. With such a range, the polishing removal rate of the object to be polished improves.

The content of the abrasives in the entire polishing composition is preferably 50% by mass or less, more preferably 30% by mass or less, and still more preferably 20% by mass or less. With such a range, the cost of the polishing composition can be reduced. Moreover, the generation of surface defects in the surface of the object to be polished after the polishing using the polishing composition can be further suppressed.

2-7 Surface Modification

The abrasives may be surface-modified. The surface-modified abrasives can be obtained by, for example, mixing metals, such as aluminum, titanium, and zirconium, or oxides thereof with abrasives which are not surface-modified to dope the surface of the abrasives with the metals, such as aluminum, titanium, and zirconium, or oxides thereof or fixing organic acids to the surface of the abrasives. Among surface-modified polishing particles, colloidal silica in which organic acid is fixed is particularly preferable.

The fixation of the organic acid to the surface of the colloidal silica is performed by chemically bonding a functional group of the organic acid to the surface of the colloidal silica, for example. In the case of simply causing the colloidal silica and the organic acid to coexist, the fixation of the organic acid to the colloidal silica is not achieved.

When the sulfonic acid which is a kind of organic acid is fixed to the colloidal silica, the fixation can be performed by, for example, the method described in "Sulfonic acid-functionalized silica through quantitative oxidation of thiol groups" Chem. Commun. 246-247 (2003). Specifically, a silane coupling agent having a thiol group, such as 3-mercaptopropyl trimethoxysilane, is caused to react to a hydroxy group of the surface of the colloidal silica for coupling, and then the thiol group is oxidized with hydrogen peroxide, whereby the colloidal silica in which the sulfonic acid is fixed to the surface can be obtained. The colloidal silica in which the sulfonic acid is fixed to the surface is mentioned as an example of the above-described "sulfo group-modified silica".

Or, when carboxylic acid is fixed to the surface of the colloidal silica, the fixation can be performed by, for example, the method described in "Novel Silane Coupling Agents Containing a Photolabile 2-Nitrobenzyl Ester for Introduction of a Carboxy Group on the Surface of Silica Gel", Chemistry Letters, 3, 228-229 (2000). Specifically, a silane coupling agent containing a photolabile 2-nitrobenzyl ester is caused to react to a hydroxy group of the surface of the colloidal silica for coupling, and then light is emitted thereto, whereby the colloidal silica in which the carboxylic acid is fixed to the surface can be obtained.

In addition, organic acids, such as sulfinic acid and a phosphonic acid group, may be fixed to the surface of the colloidal silica.

Thus, the abrasives according to this embodiment are preferably anionic group-modified silica, such as the colloidal silica in which sulfonic acid is fixed to the surface or the colloidal silica in which carboxylic acid is fixed to the surface described above, and more preferably the sulfo group-modified silica described above.

Since the zeta potential value of usual colloidal silica is close to 0 under acidic conditions, particles of the colloidal silica do not electrically repel each other and are likely to cause aggregation under the acidic conditions. On the other hand, since the colloidal silica in which the organic acid is fixed to the surface is surface-modified so that the zeta potential has a relatively large negative value even under the acidic conditions, particles of the colloidal silica strongly repel each other even under the acidic conditions and are satisfactorily dispersed. As a result, the storage stability of the polishing composition improves.

3. Dispersion Medium

A dispersion medium is not particularly limited insofar as the dispersion medium is liquid capable of dispersing components (anionic surfactant having at least one kind of acidic functional group selected from the group consisting of a sulfo group, a phosphate group, and a phosphonic acid group and a polyoxyalkylene group, abrasives, additives, and the like) of the polishing composition. As the dispersion medium, water and organic solvents are mentioned. The dispersion media can be used alone or as a mixture of two or more kinds thereof and preferably contain water. However, it is preferable to use water not containing impurities as much as possible from the viewpoint of preventing the blocking of the action of each component. Specifically, pure water or ultrapure water obtained by removing impurity ions with anion-exchange resin, and then removing contaminants through a filter or distilled water is preferable.

4. PH Adjuster

The pH value of the polishing composition is less than 7. When the pH is 7 or more, a sufficiently high polishing removal rate is not obtained to the silicon nitride film and the effects of the invention of this application are not exhibited. From the viewpoint of polishing the silicon nitride film at a higher polishing removal rate, the pH is more preferably 5 or less and still more preferably 3 or less. The lower limit of the pH is preferably 1.5 or more and more preferably 1.8 or more from the viewpoint of the handling properties.

The pH value of the polishing composition can be adjusted by the addition of the pH adjuster. The pH adjuster to be used as necessary in order to adjust the pH value of the polishing composition to a desired value may be either acid or alkali and may be either an inorganic compound or an organic compound.

Specific examples of acids as the pH adjuster include inorganic acids or organic acids, such as carboxylic acids and organic sulfuric acids. Specific examples of the inorganic acids include sulfuric acid, nitric acid, boric acid, carbonic acid, hypophosphorous acid, phosphorous acid, phosphoric acid, and the like. Specific examples of the carboxylic acids include formic acid, acetic acid, propionic acid, butyric acid, valeric acid, 2-methylbutyric acid, n-hexanoic acid, 3,3-dimethyl butyric acid, 2-ethyl butyric acid, 4-methylpentanoic acid, n-heptanoic acid, 2-methyl hexanoic acid, n-octanoic acid, 2-ethyl hexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, and the like.

Specific examples of the organic sulfuric acids include methanesulfonic acid, ethane sulfonic acid, isethionic acid, and the like. The acids may be used alone or in combination of two or more kinds thereof.

Specific examples of bases as the pH adjuster include hydroxides of alkali metals or salts thereof, hydroxides of alkaline-earth metals or salts thereof, quaternary ammonium hydroxides or salts thereof, ammonia, amine, and the like. Specific examples of the alkali metals include potassium, sodium, and the like. Specific examples of the alkaline-earth metals include calcium, strontium, and the like. Specific examples of the salts include carbonates, hydrogencarbonates, sulfates, acetates, and the like. Specific examples of the quaternary ammonium include tetramethylammonium, tetraethylammonium, tetrabutylammonium, and the like.

The quaternary ammonium hydroxide compounds include quaternary ammonium hydroxides or salts thereof. Specific examples include tetramethylammonium hydroxide, tetraethylammonium hydroxide, tetrabutylammonium hydroxide, and the like.

Specific examples of the amines include methylamine, dimethylamine, trimethylamine, ethylamine, diethylamine, triethylamine, ethylenediamine, monoethanolamine, N-(β-aminoethyl)ethanolamine, hexamethylenediamine, diethylenetriamine, triethylenetetramine, anhydrous piperazine, piperazine hexahydrate, 1-(2-aminoethyl)piperazine, N-methyl piperazine, guanidine, imidazole, and the like.

The bases may be used alone or in combination of two or more kinds thereof.

Among the bases, ammonia, ammonium salts, alkali metal hydroxides, alkali metal salts, quaternary ammonium hydroxide compounds, and amines are preferable and ammonia, potassium compounds, sodium hydroxides, quaternary ammonium hydroxide compounds, ammonium hydrogencarbonates, ammonium carbonates, sodium hydrogencarbonates, and sodium carbonates are more preferable.

It is still more preferable for the polishing composition to contain a potassium compound as the base from the viewpoint of preventing metal pollution. Examples of the potassium compounds include hydroxides of potassium or potassium salts. Specific examples include potassium hydroxide, potassium carbonate, potassium hydrogencarbonate, potassium sulfate, potassium acetate, potassium chloride, and the like.

5. Other Additives

To the polishing composition, other additives, such as oxidants, complexing agents, water-soluble polymers, antifungal agents, antiseptics, and surfactants other than the anionic surfactants described above, may be added in order to improve the performance. The oxidants, the complexing agents, the water-soluble polymers, the antifungal agents, the antiseptics, and the surfactants are not particularly limited and known substances used in the field of the polishing composition are usable.

6. Method for Manufacturing Polishing Composition

A method for manufacturing a polishing composition according to this embodiment is not limited. The polishing composition can be manufactured by stirring and mixing an anionic surfactant having at least one kind of acidic functional group selected from the group consisting of a sulfo group, a phosphate group, and a phosphonic acid group and a polyoxyalkylene group and abrasives and, as desired, various additives in a dispersion medium, such as water.

The temperature in mixing is not particularly limited and is preferably 10° C. or more and 40° C. or less. Heating may be performed in order to increase the dissolution rate. The mixing time is also not particularly limited.

7. Object to be Polished

The object to be polished according to the present invention contains a silicon nitride film. Examples of the other materials which may be contained in the object to be polished include, but are not particularly limited to, silicon containing materials other than the silicon nitride film, various insulating materials, various metal materials, and the like.

The object to be polished may be a substrate having a positively charged region in a state where the pH of the polishing composition is less than 7.

8. Polishing Method

Although the configuration of a polishing device is not particularly limited, a common polishing device is usable which is provided with a holder holding a substrate or the like having an object to be polished, an actuator, such as a motor capable of changing the rotational speed, and a polishing platen to which a polishing pad (polishing cloth) can be stuck, for example.

As the polishing pad, a general nonwoven fabric, polyurethane, porous fluororesin, and the like can be used without being particularly limited. For the polishing pad, one subjected to groove processing so as to collect a liquid polishing composition is usable.

The polishing conditions are not particularly limited and, for example, the rotational speed of the polishing platen can be set to 10 rpm or more and 500 rpm or less. Pressure (polishing pressure) to be applied to the substrate having an object to be polished can be set to 0.7 kPa (0.1 psi) or more and 69 kPa (10 psi) or less.

A method for supplying the polishing composition to the polishing pad is not particularly limited and a method for continuously supplying the polishing composition with a pump or the like is adopted, for example. Although the supply amount of the polishing composition is not limited, it is preferable that the surface of the polishing pad is always covered with the polishing composition. In the polishing of the object to be polished, the object to be polished may be polished using an undiluted solution of the polishing composition according to this embodiment as it is but the object to be polished may be polished using a diluted product obtained by diluting an undiluted solution to 10 folds or more, for example, with a dilution liquid, such as water.

After the completion of the polishing, the substrate is cleaned with running water, and then water droplets adhering onto the substrate are swept away with a spin drier or the like for drying, whereby the substrate having a layer containing a silicon containing material is obtained, for example.

Thus, the polishing composition according to this embodiment can be used for the use of polishing a substrate. More specifically, according to the method including polishing the surface of the substrate using the polishing composition according to this embodiment, the surface of the substrate can be polished at a high polishing removal rate and a substrate in which the particle residual amount on the surface of the substrate is reduced can be obtained. Examples of the substrate include a silicon wafer having a layer containing simple substance silicon, a silicon compound, metal, and the like, for example.

EXAMPLES

The present invention is described in more detail with reference to the following examples and comparative examples. However, the technical scope of the present invention is not limited only to the following examples. Unless otherwise specified, "%" and "part(s)" mean "% by mass" and "part(s) by mass", respectively. In the following examples, the operation was performed under the conditions of room temperature (25° C.)/Relative humidity RH of 40 to 50% unless otherwise specified.

Example 1

(Preparation of Polishing Composition)

A polishing composition of Example 1 was prepared by adding sodium polyoxyalkylene allyl phenyl ether sulfate (Product Name, Newkalgen FS-7S, manufactured by TAKEMOTO OIL & FAT) as an anionic surfactant so that the amount was 0.01% by mass (100 ppm) based on the final polishing composition, adding abrasives (Sulfonic acid fixed colloidal silica; Average primary particle diameter: 35 nm, Average secondary particle diameter: 70 nm) so that the amount was 8.00% by mass based the final polishing composition, and then adding maleic acid as a pH adjuster so that the pH was 2 to pure water as a dispersion medium. The pH of the polishing composition (Liquid temperature: 25° C.) was measured with a pH meter (Manufactured by HORIBA, LTD.: Model No: LAQUA).

Examples 2 to 7 and Comparative Examples 1 to 8

(Preparation of Polishing Composition)

Each polishing composition was prepared in the same manner as in Example 1, except changing the type and the content of each component and the pH of the polishing composition as given in the following table 1.

Each polishing composition obtained above was evaluated for the polishing removal rate (Removal Rate) (A/min) and the number of particle residues in accordance with the following method. The results are collectively shown in the following table 1.

For "polyoxyethylene alkyl (C10) ether phosphoric acid ester" given in Table 1, PLYSURF A210D (manufactured by Daiichi Kogyo Seiyaku Co., Ltd.) was used and "C10" means alkyl having the number of carbon atoms of 10. "POE" of "Sodium diPOE (10) lauryl ether phosphate" means "polyoxyethylene" and "10" means that the average number of repetitions of an oxyethylene unit of a polyoxyethylene group is 10. The same also applies to "Sodium diPOE (2) lauryl ether phosphate".

<Polishing Test>
(Polishing Device and Polishing Conditions)

The surface of an object to be polished was polished using each polishing composition under the following conditions. As the object to be polished, a SiN film (Silicon Nitride film) with a thickness of 2500 Å formed on the surface of a substrate was used.

Polishing device: For 300 mm wafer, One side CMP polishing machine (REFLEXION LK manufactured by Applied Materials)
Polishing pad: IC1000 (manufactured by Dow Chemical Co.)
Polishing pressure: 2 psi
Rotational speed of polishing platen: 63 rpm
Rotational speed of carrier: 57 rpm
Supply amount of polishing composition: 200 mL/min
Polishing time: 60 sec
In-situ dressing

[Post-Cleaning Treatment Process]
(Post-Cleaning Treatment: Post-Cleaning Device and Post-Cleaning Conditions)

The object to be polished which was polished by the polishing composition was cleaned by a cleaning method including rubbing the object to be polished while applying pressure with a polyvinyl alcohol (PVA) sponge which is a cleaning brush in a cleaning device attached to the polishing device under the following conditions.

Cleaning liquid: 1% ammonia aqueous solution
Supply amount of cleaning liquid: 2000 mL/min
Number of rotations of cleaning brush: 400 rpm
Number of rotations of polished object to be polished: 50 rpm
Cleaning time: 60 sec <Evaluation>

Each polishing composition was measured and evaluated for the following items.

[Measurement of Polishing Removal Rate (Polishing Rate: Removal Rate)]

The polishing removal rate (A/min) was calculated by the following expression (1).

$$\text{Polishing removal rate [Å/min]} = \frac{\text{Film thickness of object to be polished before polishing (Å)} - \text{Film thickness of object to be polished after polishing (Å)}}{\text{[Polishing time (min)]}} \quad \text{[Expression 1]}$$

The evaluation was performed by determining the film thickness of a silicon nitride film with an optical interference type film thickness meter, and then dividing a difference between the film thickness before and after polishing by the polishing time.

[Measurement of Number of Particle Residues]

The polished object to be polished after subjected to the post-cleaning treatment described above was measured for the number of particle residues by SEM observation using a Review SEM RS6000 manufactured by Hitachi, Ltd. First, 100 defects present in a remaining portion in which a 5 mm wide portion (portion from 0 mm width to 5 mm width when an outer peripheral end portion was set to 0 mm) from the outer peripheral end portion of one side of the polished substrate to be polished was excluded were sampled by the SEM observation. Subsequently, the particle residues were visually distinguished by the SEM observation from the sampled 100 defects, and then the number thereof was confirmed, whereby the rate (%) of the particle residues in the defects was calculated. Then, the product of the number of defects (counts) of 0.10 μm or more measured using a SP-2 manufactured by KLA TENCOR in the evaluation of the number of defects described above and the rate (%) of the particle residues in the defects calculated from the SEM observation result described above was calculated as the number of particle residues (counts).

The evaluation results are collectively shown in Table 1.

TABLE 1

| | Abrasives | | | | | Surfactant | | Evaluation result | |
| --- | --- | --- | --- | --- | --- | --- | --- | --- | --- |
| | Surface-modification Average secondary particle diameter | Concentration | pH adjuster Acid | Base | pH | Name of additive | Addition amount [ppm] | Number of particle residues [counts] | SiN polishing removal rate [Å/min] |
| Ex. 1 | Anionic group-surface modification 70 nm | 8.00% | Maleic acid | — | 2 | Sodium polyoxyalkylene allyl phenyl ether sulfate | 100 | 41 | 424 |

TABLE 1-continued

| | Abrasives | | | | | Surfactant | | Evaluation result | |
|---|---|---|---|---|---|---|---|---|---|
| | Surface-modification Average secondary particle diameter | Concentration | pH adjuster Acid | pH adjuster Base | pH | Name of additive | Addition amount [ppm] | Number of particle residues [counts] | SiN polishing removal rate [Å/min] |
| Ex. 2 | Anionic group-surface modification 70 nm | 8.00% | Maleic acid | — | 2 | Polyoxyethylene alkyl (C10) ether phosphoric acid ester | 100 | 217 | 412 |
| Ex. 3 | Anionic group-surface modification 70 nm | 8.00% | Maleic acid | Imidazole | 5 | Polyoxyethylene alkyl (C10) ether phosphoric acid ester | 100 | 265 | 428 |
| Ex. 4 | Anionic group-surface modification 70 nm | 8.00% | Maleic acid | — | 2 | Sodium diPOE (10) lauryl ether phosphate | 100 | 127 | 418 |
| Ex. 5 | Anionic group-surface modification 70 nm | 8.00% | Maleic acid | — | 2 | Sodium diPOE (2) lauryl ether phosphate | 100 | 342 | 430 |
| Ex. 6 | Anionic group-surface modification 70 nm | 8.00% | Maleic acid | — | 2 | Polyoxyethylene alkyl (C10) ether phosphoric acid ester | 10 | 453 | 422 |
| Ex. 7 | Anionic group-surface modification 70 nm | 8.00% | Maleic acid | — | 2 | Polyoxyethylene alkyl (C10) ether phosphoric acid ester | 500 | 53 | 401 |
| Comp. Ex. 1 | Anionic group-surface modification 70 nm | 8.00% | Maleic acid | — | 2 | No additive | 100 | 869 | 420 |
| Comp. Ex. 2 | Anionic group-surface modification 70 nm | 8.00% | Maleic acid | — | 2 | Laurylbenzenesulfonic acid sodium salt | 100 | 994 | 385 |
| Comp. Ex. 3 | Anionic group-surface modification 70 nm | 8.00% | Maleic acid | — | 2 | Polyoxyethylene lauryl ether acetate | 100 | 986 | 428 |
| Comp. Ex. 4 | Anionic group-surface modification 70 nm | 8.00% | Maleic acid | — | 2 | Polyoxyethylene sorbitan fatty acid ester | 100 | 1868 | 413 |
| Comp. Ex. 5 | Anionic group-surface modification 70 nm | 8.00% | Maleic acid | — | 2 | Benzalkonium chloride | 100 | 2592 | 396 |
| Comp. Ex. 6 | Anionic group-surface modification 70 nm | 8.00% | Maleic acid | — | 2 | Acetylene grycol | 100 | 953 | 418 |
| Comp. Ex. 7 | Anionic group-surface modification 70 nm | 8.00% | Maleic acid | — | 2 | Naphthalene sulfonic acid formalin condensate | 100 | 128 | 23 |
| Comp. Ex. 8 | Anionic group-surface modification 70 nm | 8.00% | — | KOH | 8 | Polyoxyethylene alkyl (C10) ether phosphoric acid ester | 100 | 85 | 69 |

According to the results of Table 1, the amount of the particles (abrasives) remaining on the polished surface after the polishing of the silicon nitride film was able to be effectively reduced and a high polishing removal rate of the silicon nitride film was able to be maintained by the use of the polishing compositions of Examples 1 to 7 containing a specific anionic surfactant as compared with Comparative Examples 1 to 8.

In the case where the anionic surfactant does not have a polyoxyalkylene group as in Comparative Example 2 and the case where the anionic surfactants do not have specific acidic functional groups, such as a sulfo group, a phosphate group, and a phosphonic acid group, as in Comparative Examples 3 to 6, the effect of reducing the amount of the particles (abrasives) remaining on the polished surface after the polishing of the silicon nitride film is not sufficiently obtained. This is considered to be because, when the anionic surfactant does not have a polyoxyalkylene group, the dispersion action of the particles (abrasives) is not sufficient and, when the anionic surfactant does not have the specific acidic functional group, the electrostatic repulsion force caused by an ionized acidic functional group is not obtained, and therefore the re-adhesion of the particles to the substrate cannot be prevented. Moreover, when the polymer having a weight average molecular weight of more than 1,000 was used as in Comparative Example 7 (Naphthalene sulfonic acid formalin condensate: Weight average molecular weight of about 20,000), the polishing removal rate of the silicon nitride film tends to sharply decrease. It is considered that the polymer creates a thick protective film on the substrate surface containing the silicon nitride film, and therefore the polishing composition cannot act on the substrate, which leads to the suppression of the adhesion of the particles (abrasives) but a sharp reduction in the polishing removal rate. Moreover, when the pH is 7 or more as in Comparative Example 8, the polishing removal rate of the silicon nitride film tends to sharply decrease. This is considered to be because, the surface zeta potentials of both the colloidal silica and the silicon nitride film are negatively charged in a region where the pH is 7 or more, and therefore the contact frequency of the colloidal silica and the silicon nitride film during the polishing sharply decreases due to the electrostatic repulsion force.

What is claimed is:
1. A polishing composition comprising:
   abrasives;
   an anionic surfactant; and
   a dispersion medium, wherein
   the anionic surfactant has at least one kind of acidic functional group selected from the group consisting of a sulfo group, a phosphate group, and a phosphonic acid group and a polyoxyalkylene group,
   wherein the polyoxyalkylene group is bonded to the acidic functional group,
   the weight average molecular weight of the anionic surfactant is within a range of 200 or more and 1,000 or less, the pH is less than 7, the aspect ratio of the abrasives is less than 1.4, and the polishing composition is used for polishing an object to be polished containing a silicon nitride film.

2. The polishing composition according to claim 1, wherein the abrasives are anionic group-modified silica.

3. The polishing composition according to claim 1, wherein the abrasives are sulfo group-modified silica.

4. The polishing composition according to claim 1, wherein the polyoxyalkylene group is at least one kind of functional group selected from a polyoxymethylene group, a polyoxyethylene group, a polyoxypropylene group, and a polyoxybutylene group.

5. The polishing composition according to claim 1, wherein a number of repetitions of the polyoxyalkylene group is within a range of 1 or more and 6 or less.

6. The polishing composition according to claim 1, wherein the pH is 3 or less.

7. The polishing composition according to claim 1, wherein a content of the anionic surfactant is within a range of 0.0005% by mass or more and 0.1% by mass or less based on the entire polishing composition.

8. A method for manufacturing the polishing composition according to claim 1, the method comprising:

mixing the abrasives, the anionic surfactant, and the dispersion medium; and setting the pH to less than 7.

9. A polishing method comprising:

polishing an object to be polished containing a silicon nitride film using the polishing composition according to claim 1.

10. A method for manufacturing a substrate comprising:

polishing a surface of the substrate using the polishing composition according to claim 1.

11. The polishing composition according to claim 2, wherein the polyoxyalkylene group is at least one kind of functional group selected from a polyoxymethylene group, a polyoxyethylene group, a polyoxypropylene group, and a polyoxybutylene group.

12. The polishing composition according to claim 3, wherein the polyoxyalkylene group is at least one kind of functional group selected from a polyoxymethylene group, a polyoxyethylene group, a polyoxypropylene group, and a polyoxybutylene group.

13. The polishing composition according to claim 2, wherein a number of repetitions of the polyoxyalkylene group is within a range of 1 or more and 6 or less.

14. The polishing composition according to claim 3, wherein a number of repetitions of the polyoxyalkylene group is within a range of 1 or more and 6 or less.

* * * * *